United States Patent
Sakurada et al.

(10) Patent No.: US 9,938,634 B2
(45) Date of Patent: Apr. 10, 2018

(54) METHOD OF PRODUCING SILICON SINGLE CRYSTAL

(71) Applicant: SHIN-ETSU HANDOTAI CO., LTD., Tokyo (JP)

(72) Inventors: Masahiro Sakurada, Annaka (JP); Junya Tokue, Iwaki (JP); Ryoji Hoshi, Nishigo-mura (JP); Izumi Fusegawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 7 days.

(21) Appl. No.: 14/787,368

(22) PCT Filed: May 8, 2014

(86) PCT No.: PCT/JP2014/002437
§ 371 (c)(1),
(2) Date: Oct. 27, 2015

(87) PCT Pub. No.: WO2014/192232
PCT Pub. Date: Dec. 4, 2014

(65) Prior Publication Data
US 2016/0068992 A1 Mar. 10, 2016

(30) Foreign Application Priority Data
May 29, 2013 (JP) ................... 2013-112521

(51) Int. Cl.
*C30B 15/04* (2006.01)
*C30B 29/06* (2006.01)
(Continued)

(52) U.S. Cl.
CPC ............ *C30B 15/04* (2013.01); *C30B 15/305* (2013.01); *C30B 29/06* (2013.01); *C30B 30/04* (2013.01)

(58) Field of Classification Search
CPC combination set(s) only.
See application file for complete search history.

(56) References Cited

U.S. PATENT DOCUMENTS 6,004,393 A * 12/1999 Maeda .................... C30B 15/20
117/200
2011/0056428 A1 3/2011 Uto et al.

FOREIGN PATENT DOCUMENTS

CA 1336061 C 6/1995
CN 86106346 A 6/1987
(Continued)

OTHER PUBLICATIONS

Feb. 9, 2016 Office Action issued in Japanese Patent Application No. 2013-112521.
(Continued)

*Primary Examiner* — Duy Vu N Deo
*Assistant Examiner* — Erin F Bergner
(74) *Attorney, Agent, or Firm* — Oliff PLC

(57) ABSTRACT

A method of producing a phosphorus-doped silicon single crystal, including pulling the phosphorus-doped silicon single crystal from a silicon melt doped with phosphorus by Magnetic field applied Czochralski (MCZ) method, wherein the phosphorus is doped such that a phosphorus concentration of the phosphorus-doped silicon single crystal is $2\times10^{16}$ atoms/cm$^3$ or more, and a horizontal magnetic field is applied to the silicon melt with a central magnetic field strength of 2,000 gauss or more such that the phosphorus-doped silicon single crystal to be produced has an oxygen concentration of $1.6\times10^{18}$ atoms/cm$^3$ (ASTM'79) or more. A method of producing a silicon single crystal that is heavily doped with phosphorus and has an oxygen concentration of $1.6\times10^{18}$ atoms/cm$^3$ (ASTM'79) or more.

3 Claims, 2 Drawing Sheets

(51) Int. Cl.
*C30B 15/30* (2006.01)
*C30B 30/04* (2006.01)

(56) References Cited

FOREIGN PATENT DOCUMENTS

| JP | 2008-189523 A | 8/2008 |
| JP | 2010-265143 A | 11/2010 |
| JP | 2011-057476 A | 3/2011 |
| JP | 4953386 B2 | 6/2012 |
| JP | 2013-23415 A | 2/2013 |

OTHER PUBLICATIONS

Dec. 1, 2015 International Preliminary Report on Patentability issued in International Patent Application No. PCT/JP2014/002437.
Mar. 2, 2017 Office Action issued in Chinese Patent Application No. 201480030832.6.
Dupret, F. et al., "Global Modelling of Heat Transfer in Crystal Growth Furnaces," Int., J. Heat Mass Transfer, vol. 33, No. 9, (1990), pp. 1849-1871.
Jul. 15, 2014 Search Report issued in International Patent Application No. PCT/JP2014/002437.
Oct. 23, 2017 Office Action mailed in Chinese Application No. 201480030832.

* cited by examiner

METHOD OF PRODUCING SILICON SINGLE CRYSTAL

TECHNICAL FIELD

The present invention relates to a method of producing a phosphorus-doped silicon single crystal by the MCZ method.

BACKGROUND ART

Silicon single crystal that is mainly produced by a Czochralski (CZ) method is sliced into silicon wafers to be used as substrates for semiconductor devices such as memories or image sensors. This silicon single crystal produced by the CZ method contains oxygen atoms. In fabrication of devices with the silicon wafers sliced from such silicon single crystal, silicon atoms and oxygen atoms are combined to form oxide precipitates and bulk micro defects (BMDs).

It is known that these oxide precipitates and BMDs provide intrinsic gettering (IG) capability to capture contaminant atoms such as heavy metal atoms in the interior of wafers and thereby to improve device characteristics. Wafers having a larger amount of oxide precipitates or a higher BMD density in its bulk allow high-performance devices with high reliability to be obtained.

In recent years, there is a need for semiconductor devices having radiation resistance that use silicon wafers doped with phosphorus. Use of substrates having a high oxygen concentration for such devices enables great improvement in device characteristics.

In production of a single crystal, an oxygen concentration is controlled during its growth so as to be taken in the crystal at a high concentration, in order to give these semiconductor devices useful IG capability and a high oxygen concentration.

There is also an increasing need for various wafers: polished wafers obtained by performing mirror polishing on silicon wafers sliced from a silicon single crystal produced in the above manner; annealed wafers obtained from the polished wafers subjected to an annealing process to suppress defects in their surface layer or to form an intrinsic gettering (IG) layer in their bulk; epitaxial wafers each having a formed epitaxial layer; and SOI wafers.

Since these wafers are subjected to multistage device processes, there are factors in impeding electrical characteristics: metallic impurities intrude into device regions during these processes; intrusion of radial rays or cosmic rays into device regions gives rise to ionization. It is accordingly an essential problem to advance a technique to prevent spread of harmful impurities such as an uneven image for an image sensor, or to neutralize the ionization due to radial rays or cosmic rays for a device having radiation resistance. A technique to pull a crystal that particularly is doped with phosphorus and has a high oxygen concentration of $1.6 \times 10^{18}$ atoms/cm$^3$ (ASTM'79) or more is requested for use in some image sensors and devices having radiation resistance.

CITATION LIST

Patent Literature

Patent Document 1: Japanese Patent No. 4953386
Patent Document 2: Japanese Unexamined Patent publication (Kokai) No. 2008-189523

SUMMARY OF INVENTION

Technical Problem

Patent Documents 1 and 2 propose a method of adjusting the oxygen concentration of a silicon single crystal to a high concentration, but describe no method of adjusting this oxygen concentration to $1.6 \times 10^{18}$ atoms/cm$^3$ (ASTM'79) or more. It is not easy to adjust the oxygen concentration to $1.6 \times 10^{18}$ atoms/cm$^3$ (ASTM'79) or more over the entire length of the straight body of a single crystal. It is particularly difficult to adjust the oxygen concentration to $1.6 \times 10^{18}$ atoms/cm$^3$ (ASTM'79) or more during pulling of the second half of the straight body of a single crystal because the amount of a melt is decreased and a contact area between the wall of a quartz crucible and the melt is also decreased.

The present invention was accomplished in view of the above-described problems. It is an object of the present invention to provide a method of producing a silicon single crystal that is heavily doped with phosphorus and has an oxygen concentration of $1.6 \times 10^{18}$ atoms/cm$^3$ (ASTM'79) or more.

Solution to Problem

To achieve this object, the present invention provides a method of producing a phosphorus-doped silicon single crystal, comprising pulling the phosphorus-doped silicon single crystal from a silicon melt doped with phosphorus by Magnetic field applied Czochralski (MCZ) method, wherein the phosphorus is doped such that a phosphorus concentration of the phosphorus-doped silicon single crystal is $2 \times 10^{16}$ atoms/cm$^3$ or more, and a horizontal magnetic field is applied to the silicon melt with a central magnetic field strength of 2,000 gauss or more such that the phosphorus-doped silicon single crystal to be produced has an oxygen concentration of $1.6 \times 10^{18}$ atoms/cm$^3$ (ASTM'79) or more.

This method can produce a silicon single crystal that is heavily doped with phosphorus and has an oxygen concentration of $1.6 \times 10^{18}$ atoms/cm$^3$ (ASTM'79) or more. In particular, the method can achieve a high oxygen concentration over substantially the entire length of a straight body of the crystal.

The step of pulling the phosphorus-doped silicon single crystal preferably includes adjusting a pressure of an interior of a furnace in a single-crystal pulling apparatus for use in pulling the phosphorus-doped silicon single crystal to 100 hPa or more.

In this manner, the method can produce a phosphorus-doped silicon single crystal having a higher oxygen concentration over substantially the entire length of the straight body of the crystal.

Advantageous Effects of Invention

The present invention enables production of a silicon single crystal that is heavily doped with phosphorus and has an oxygen concentration of $1.6 \times 10^{18}$ atoms/cm$^3$ (ASTM'79) or more, as described above. In particular, the invention can achieve a silicon single crystal that is heavily doped with phosphorus and has a high oxygen concentration over substantially the entire length of the straight body of the crystal. In addition, high quality silicon wafers having excellent electrical characteristics can be obtained from this phosphorus-heavily-doped silicon single crystal. These wafers can form a very high density of BMD layer in the interior of their bulk by a device process, and eliminate factors in impeding electrical characteristics depending on use. Thus, these wafers can be suitably used, for example, for memories, image sensors, and substrates for semiconductor devices having radiation resistance.

DESCRIPTION OF EMBODIMENTS

In production of a silicon single crystal, it is difficult to adjust the oxygen concentration to $1.6 \times 10^{18}$ atoms/cm³ (ASTM'79) or more over the entire length of the straight body of this single crystal, as described previously. A pulling technique of a silicon single crystal that particularly is heavily doped with phosphorus and has an oxygen concentration of $1.6 \times 10^{18}$ atoms/cm³ (ASTM'79) or more over the entire length of this straight body is requested to be developed for use in some image sensors and devices having radiation resistance.

The present inventors diligently considered this problem and consequently found that a process of applying a horizontal magnetic field in production of a silicon single crystal heavily doped with phosphorus allows this produced phosphorus doped silicon single crystal to have a high oxygen concentration over substantially the entire length of its straight body, thereby brought the invention to completion.

The invention is directed to a method of producing a phosphorus-doped silicon single crystal, comprising pulling the phosphorus-doped silicon single crystal from a silicon melt doped with phosphorus by Magnetic field applied Czochralski (MCZ) method. The phosphorus is doped such that a phosphorus concentration of the phosphorus-doped silicon single crystal is $2 \times 10^{16}$ atoms/cm³ or more, and a horizontal magnetic field is applied to the silicon melt with a central magnetic field strength of 2,000 gauss or more such that the phosphorus-doped silicon single crystal to be produced has an oxygen concentration of $1.6 \times 10^{18}$ atoms/cm³ (ASTM'79) or more.

An embodiment of the present invention will hereinafter be specifically described with reference to the drawings, but the present invention is not limited to this embodiment.

Figure 1:
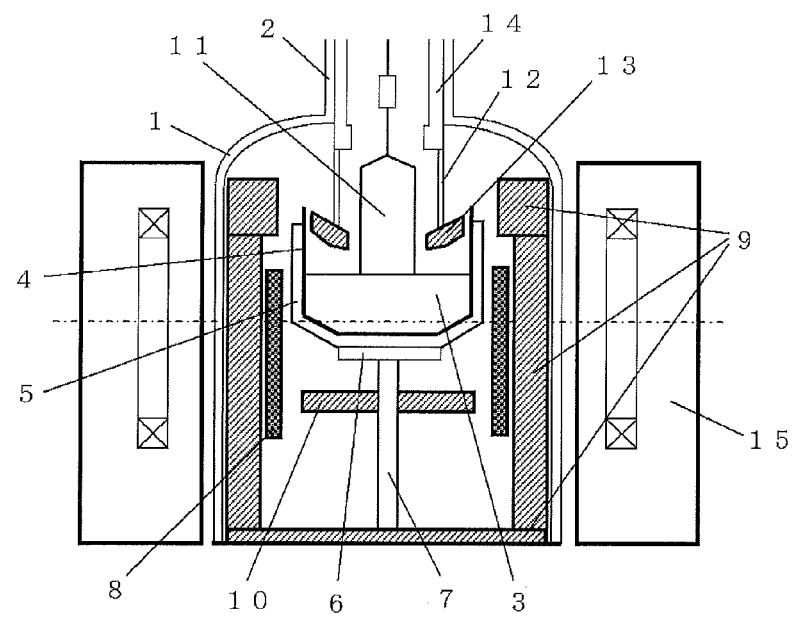
FIG. 1 is a schematic diagram showing an example of a single-crystal pulling apparatus that can be used in the present invention.

FIG. 1 is a schematic diagram showing an example of a single-crystal pulling apparatus that can be used in the inventive method of producing a phosphorus-doped silicon single crystal. This embodiment of the invention will be described below on the basis of FIG. 1.

The single-crystal pulling apparatus used in the invention has a main chamber 1 and a pull chamber 2. In the interior of this main chamber 1, a quartz crucible 4 to contain a raw material melt 3 and a graphite crucible 5 to support the quartz crucible 4 are provided. These crucibles are supported through a receiver 6 disposed on a supporting shaft 7. A heater 8 is disposed outside the crucibles. A heat insulating material 9 is disposed outside this heater along the inner wall of the main chamber. A lower heat insulating material 10 can also be provided as needed. A cooling cylinder 14 to cool a phosphorus-doped silicon single crystal 11 pulled, and a cylindrical gas-flow guiding cylinder 12 made of graphite with a heat insulating plate 13 provided at its lower end to restrict radiant heat from the raw material melt 3 and the heater 8 are disposed above the crucibles.

Moreover, heat can be inhibited from being removed from an upper portion of the main chamber 1 by taking countermeasures: widening the distance between a lower portion of the gas-flow guiding cylinder 12 and the surface of the raw material melt, or moving the center of heat generation by driving the heater 8, other than heat insulation of an upper portion of the cooling cylinder 14.

In the invention, the silicon single crystal is pulled by the magnetic field applied CZ (MCZ) method while a horizontal magnetic field is applied. The single-crystal pulling apparatus used in the invention is therefore provided with a magnet 15 to apply the horizontal magnetic field, outside the main chamber 1. The MCZ method has various magnetic-field configurations such as a vertical magnetic field, a horizontal magnetic field, or a cusped magnetic field, and can control the oxygen concentration according to designs such as distribution of lines of magnetic force, or a magnetic field strength.

The convection of the raw material melt 3 under no magnetic field provides transportation of a large amount of oxygen in the interior of the melt, thereby increasing the amount of oxygen carried to a surface portion of the melt. This increase in amount of oxygen carried to the surface portion of the melt significantly increases the amount of oxygen to be evaporated, thereby making it easy to decrease oxygen in the melt. In contrast, the MCZ, particularly using a horizontal magnetic field, reduces the amount of oxygen carried to the surface portion of the melt and the amount of oxygen to be evaporated if the raw material melt 3 is under a strong magnetic field, thereby enabling control of the amount of oxygen in the melt.

When the inventive method of producing a phosphorus-doped silicon single crystal is implemented with the single-crystal pulling apparatus of this type, polycrystalline silicon, a raw material of a silicon single crystal, is charged into the quartz crucible 4. At this time, phosphorus is added as a dopant to determine the n-type resistivity of a substrate. Besides this dopant to control the resistivity, the melt can also be doped with nitrogen or carbon depending on use. After the raw material is charged into the quartz crucible 4, an inert gas, such as argon gas, is introduced through a gas inlet (not shown) disposed in the pull chamber 2 and discharged through a gas outlet (not shown) by operating a vacuum pump (not shown), so the interior is replaced into an inert gas atmosphere. The raw material is then heated and melted by the heater 8 disposed so as to surround the graphite crucible 5 so that the raw material melt 3 is obtained. After the raw material is melted, a seed crystal is dipped into the raw material melt 3 and pulled with being rotated to grow an ingot of the phosphorus-doped silicon single crystal 11.

During pulling of the single crystal, the inner surface of the quartz crucible 4 on the melt side is heated to high temperatures by the heater 8 and gradually melted, and oxygen is thereby dissolved into the raw material melt 3. Although most of the dissolved oxygen evaporates from the melt surface to form SiO vapor, the other oxygen in a very small amount is taken in the phosphorus-doped silicon single crystal 11 to be grown.

Important considerations to take oxygen in the phosphorus-doped silicon single crystal 11 at a high concentration are rotation of a crystal axis and the supporting shaft 7 of the single-crystal pulling apparatus (i.e., rotation of the growing crystal and the crucibles), a single-crystal growth rate, control of a furnace pressure and a flow rate of an inert gas such as an argon gas, a proper layout of a hot zone structure including the heater 8, and so on.

This embodiment of the invention uses simulation software, FEMAG, of numerical thermal analysis to calculate the optimum structure of the hot zone provided in the main chamber 1, the optimum conditions of, for example, positional relationship between the raw material melt surface and the center of heat generation, and the conditions of the convection of the inert gas in the main chamber 1 (Literature: F. Dupret, P. Nicodeme, Y. Ryckmans, P. Wouters, and M. J. Crochet, Int. J. Heat Mass Transfer, 33, 1849 (1990)).

In the invention, a phosphorus dopant is introduced into the melt such that the phosphorus concentration of the phosphorus-doped silicon single crystal 11 is $2 \times 10^{16}$ atoms/cm$^3$ or more. The amount of this phosphorus dopant need only be equal to or less than the solubility limit. This range of phosphorus concentration in the phosphorus-doped silicon single crystal 11 allows wafers to have a resistivity of 0.2 Ωcm or less. The phosphorus-doped silicon single crystal 11 having a phosphorus concentration of $2 \times 10^{16}$ atoms/cm$^3$ or more and a straight body with an oxygen concentration of $1.6 \times 10^{18}$ atoms/cm$^3$ (ASTM'79) or more over the entire length of the straight body can be used for recently required devices such as semiconductor devices having radiation resistance. This oxygen concentration need only be equal to or less than the solubility limit.

The dopant may be introduced when the polycrystalline silicon is charged in the quartz crucible 4, or after this polycrystalline silicon is completely melted by the heater 8. An alloy of silicon crystal and phosphorus, or red phosphorus may be used as the dopant.

Since phosphorus is a volatile element, a high concentration of phosphorus dopant increases its vapor pressure but instead reduces the vapor pressure of SiO. The reduction in oxygen to be evaporated into SiO enables the inhibition of a decrease in oxygen concentration in the raw material melt 3, consequently increasing the amount of oxygen taken in the interior of the phosphorus-doped silicon single crystal 11. In other words, a high concentration of phosphorus dopant makes it easy to take oxygen in the crystal. The amount of phosphorus and SiO to be evaporated can also be controlled, for example, by the flow rate of the inert gas or adjustment of the furnace pressure.

When the single crystal is pulled in the invention, a horizontal magnetic field is applied to the raw material melt 3 by the magnet 15 such that the central magnetic field strength is 2,000 gauss or more. If the strength of the horizontal magnetic field applied is less than 2,000 gauss, then the convection of the raw material melt 3 is insufficiently inhibited and the evaporation of SiO is slightly inhibited; a phosphorus-doped silicon single crystal having an oxygen concentration of $1.6 \times 10^{18}$ atoms/cm$^3$ (ASTM'79) or more cannot thus be obtained. The strength of the horizontal magnetic field to be applied preferably ranges from 3,000 gauss to 5,000 gauss.

When the phosphorus-doped silicon single crystal 11 is pulled, the pressure of the interior of the furnace in the single-crystal pulling apparatus is preferably adjusted to 100 hPa or more. This range of the furnace pressure inhibits the evaporation of SiO, thereby enabling production of a phosphorus-doped silicon single crystal having a higher oxygen concentration over substantially the entire length of its straight body. The interior of the furnace, however, is preferably under reduced pressure to facilitate the removal of SiO from the furnace; this reduced pressure is preferably 1013.25 hPa (1 atm) or less, more preferably 600 hPa or less.

Wafers sliced from the phosphorus-doped silicon single crystal 11 produced by the inventive method may be used in a device process as mirror-polished wafers after these sliced wafers are subjected to only a mirror polishing process. Alternatively, these mirror-polished wafers may be subjected to various processes: annealing, ion implantation, the fabrication process of epitaxial wafers by growing an epitaxial layer on their surface, or the fabrication process of SOI wafers by using these mirror-polished wafers as raw material.

The invention can be used without being limited to the crystal orientation, etc., of a silicon single crystal to be produced.

In this way, the invention can produce a silicon single crystal that is heavily doped with phosphorus and has an oxygen concentration of $1.6 \times 10^{18}$ atoms/cm$^3$ (ASTM'79) or more. In particular, the invention can achieve a silicon single crystal that is heavily doped with phosphorus and has a high oxygen concentration over substantially the entire length of its straight body. In addition, high quality silicon wafers having excellent electrical characteristics can be obtained from this phosphorus-heavily-doped silicon single crystal. These wafers can form a very high density of BMD layer in the interior of their bulk by a device process, and eliminate factors in impeding electrical characteristics depending on use. Thus, these wafers can be suitably used, for example, for memories, image sensors, and substrates for semiconductor devices having radiation resistance.

EXAMPLE

The present invention will be more specifically described below with reference to examples and comparative examples, but the invention is not limited to these examples.

Example 1

Raw material of 360-kg polycrystalline silicon was charged into a quartz crucible having a diameter of 32 inches (800 mm) disposed inside a main chamber of a single-crystal pulling apparatus. This raw material was heated and melted with a heater. A phosphorus dopant was introduced to adjust resistivity such that the phosphorus concentration of the shoulder of a single crystal to be pulled was $2.5 \times 10^{16}$ atoms/cm$^3$. The phosphorus concentration of the straight body of the single crystal was $2.5 \times 10^{16}$ atoms/cm$^3$ or more over its entire length. The pressure of the furnace of the single-crystal pulling apparatus was 150 hPa during pulling of the single crystal. The silicon single crystal of n-type was grown so as to have a diameter of 300 mm and a straight body length of 140 cm while a horizontal magnetic field was applied with a central magnetic field strength of 3,000 gauss by the MCZ method.

Wafers were sampled from the silicon single crystal pulled at positions of 0, 20, 40, 60, 80, 100, 120, and 140 cm away from its shoulder. The oxygen concentration of these wafers at the positions measured by FT-IR is shown in Table 1 below.

TABLE 1

EXAMPLE 1

| POSITION IN CRYSTAL cm | OXYGEN CONCENTRATION (ASTM' 79) × $10^{18}$ atoms/cm$^3$ |
|---|---|
| 0 | 1.66 |
| 20 | 1.65 |
| 40 | 1.64 |
| 60 | 1.66 |
| 80 | 1.69 |
| 100 | 1.70 |
| 120 | 1.72 |
| 140 | 1.73 |

As shown in Table 1, the oxygen concentration of the silicon single crystal produced under conditions of example 1 ranged from $1.64 \times 10^{18}$ to $1.73 \times 10^{18}$ atoms/cm$^3$ (ASTM'79).

Example 2

Raw material of 360-kg polycrystalline silicon was charged into a quartz crucible having a diameter of 32 inches (800 mm) disposed inside a main chamber of a single-crystal pulling apparatus, as in example 1. This raw material was heated and melted with a heater. A phosphorus dopant was introduced to adjust resistivity such that the phosphorus concentration of the shoulder of a single crystal to be pulled was $2.5 \times 10^{16}$ atoms/cm$^3$. The phosphorus concentration of the straight body of the single crystal was $2.5 \times 10^{16}$ atoms/cm$^3$ or more over its entire length. The pressure of the furnace of the single-crystal pulling apparatus was 150 hPa during pulling of the single crystal. The silicon single crystal of n-type was grown so as to have a diameter of 300 mm and a straight body length of 140 cm while a horizontal magnetic field was applied with a central magnetic field strength of 2,200 gauss by the MCZ method. The other conditions were the same as example 1 to pull this single crystal.

Wafers were sampled from the silicon single crystal pulled at positions of 0, 20, 40, 60, 80, 100, 120, and 140 cm away from its shoulder. The oxygen concentration of these wafers at the positions measured by FT-IR is shown in Table 2 below.

TABLE 2

EXAMPLE 2

| POSITION IN CRYSTAL cm | OXYGEN CONCENTRATION (ASTM' 79) × $10^{18}$ atoms/cm$^3$ |
|---|---|
| 0 | 1.64 |
| 20 | 1.62 |
| 40 | 1.62 |
| 60 | 1.65 |
| 80 | 1.65 |
| 100 | 1.65 |
| 120 | 1.66 |
| 140 | 1.68 |

As shown in Table 2, the oxygen concentration of the silicon single crystal produced under conditions of example 2 ranged from $1.62 \times 10^{18}$ to $1.68 \times 10^{18}$ atoms/cm$^3$ (ASTM'79).

Example 3

Raw material of 360-kg polycrystalline silicon was charged into a quartz crucible having a diameter of 32 inches (800 mm) disposed inside a main chamber of a single-crystal pulling apparatus, as in example 1. This raw material was heated and melted with a heater. A phosphorus dopant was introduced to adjust resistivity such that the phosphorus concentration of the shoulder of a single crystal to be pulled was $2.5 \times 10^{18}$ atoms/cm$^3$. The phosphorus concentration of the straight body of the single crystal was $2.5 \times 10^{18}$ atoms/cm$^3$ or more over its entire length. The pressure of the furnace of the single-crystal pulling apparatus was 80 hPa during pulling of the single crystal. The silicon single crystal of n-type was grown so as to have a diameter of 300 mm and a straight body length of 140 cm while a horizontal magnetic field was applied with a central magnetic field strength of 3,000 gauss by the MCZ method. The other conditions were the same as example 1 to pull this single crystal.

Wafers were sampled from the silicon single crystal pulled at positions of 0, 20, 40, 60, 80, 100, 120, and 140 cm away from its shoulder. The oxygen concentration of these wafers at the positions measured by FT-IR is shown in Table 3 below.

TABLE 3

EXAMPLE 3

| POSITION IN CRYSTAL cm | OXYGEN CONCENTRATION (ASTM' 79) × $10^{18}$ atoms/cm$^3$ |
|---|---|
| 0 | 1.62 |
| 20 | 1.61 |
| 40 | 1.60 |
| 60 | 1.62 |
| 80 | 1.62 |
| 100 | 1.62 |
| 120 | 1.63 |
| 140 | 1.64 |

As shown in Table 3, the oxygen concentration of the silicon single crystal produced under conditions of example 3 ranged from $1.60 \times 10^{18}$ to $1.64 \times 10^{18}$ atoms/cm$^3$ (ASTM'79).

Comparative Example 1

Raw material of 360-kg polycrystalline silicon was charged into a quartz crucible having a diameter of 32 inches (800 mm) disposed inside a main chamber of a single-crystal pulling apparatus, as in example 1. This raw material was heated and melted with a heater. A phosphorus dopant was introduced to adjust resistivity such that the phosphorus concentration of the tail of a single crystal to be pulled was $1.1 \times 10^{16}$ atoms/cm$^3$. The phosphorus concentration of the straight body of the single crystal was $1.1 \times 10^{16}$ atoms/cm$^3$ or less over its entire length. The pressure of the furnace of the single-crystal pulling apparatus was 150 hPa during pulling of the single crystal. The silicon single crystal of n-type was grown so as to have a diameter of 300 mm and a straight body length of 140 cm while a horizontal magnetic field was applied with a central magnetic field strength of 3,000 gauss by the MCZ method. The other conditions were the same as example 1 to pull this single crystal.

Wafers were sampled from the silicon single crystal pulled at positions of 0, 20, 40, 60, 80, 100, 120, and 140 cm away from its shoulder. The oxygen concentration of these wafers at the positions measured by FT-IR is shown in Table 4 below.

TABLE 4

COMPARATIVE EXAMPLE 1

| POSITION IN CRYSTAL cm | OXYGEN CONCENTRATION (ASTM' 79) × $10^{18}$ atoms/cm$^3$ |
|---|---|
| 0 | 1.43 |
| 20 | 1.42 |
| 40 | 1.41 |
| 60 | 1.42 |
| 80 | 1.44 |
| 100 | 1.46 |
| 120 | 1.46 |
| 140 | 1.42 |

As shown in Table 4, the oxygen concentration of the silicon single crystal produced under conditions of comparative example 1 ranged from $1.41 \times 10^{18}$ to $1.46 \times 10^{18}$ atoms/cm$^3$ (ASTM'79).

Comparative Example 2

Raw material of 360-kg polycrystalline silicon was charged into a quartz crucible having a diameter of 32 inches (800 mm) disposed inside a main chamber of a single-crystal pulling apparatus, as in example 1. This raw material was heated and melted with a heater. A phosphorus dopant was introduced to adjust resistivity such that the phosphorus concentration of the shoulder of a single crystal to be pulled was $2.5 \times 10^{16}$ atoms/cm$^3$. The phosphorus concentration of the straight body of the single crystal was $2.5 \times 10^{16}$ atoms/cm$^3$ or more over its entire length. The pressure of the furnace of the single-crystal pulling apparatus was 150 hPa during pulling of the single crystal. The silicon single crystal of n-type was grown so as to have a diameter of 300 mm and a straight body length of 140 cm while a horizontal magnetic field was applied with a central magnetic field strength of 1,500 gauss by the MCZ method. The other conditions were the same as example 1 to pull this single crystal.

Wafers were sampled from the silicon single crystal pulled at positions of 0, 20, 40, 60, 80, 100, 120, and 140 cm away from its shoulder. The oxygen concentration of these wafers at the positions measured by FT-IR is shown in Table 5 below.

TABLE 5

COMPARATIVE EXAMPLE 2

| POSITION IN CRYSTAL cm | OXYGEN CONCENTRATION (ASTM' 79) × $10^{18}$ atoms/cm$^3$ |
|---|---|
| 0 | 1.47 |
| 20 | 1.46 |
| 40 | 1.45 |
| 60 | 1.46 |
| 80 | 1.48 |
| 100 | 1.49 |
| 120 | 1.50 |
| 140 | 1.47 |

As shown in Table 5, the oxygen concentration of the silicon single crystal produced under conditions of comparative example 2 ranged from $1.45 \times 10^{18}$ to $1.50 \times 10^{18}$ atoms/cm$^3$ (ASTM'79).

Comparative Example 3

Raw material of 360-kg polycrystalline silicon was charged into a quartz crucible having a diameter of 32 inches (800 mm) disposed inside a main chamber of a single-crystal pulling apparatus, as in example 1. This raw material was heated and melted with a heater. A phosphorus dopant was introduced to adjust resistivity such that the phosphorus concentration of the tail of a single crystal to be pulled was $1.1 \times 10^{16}$ atoms/cm$^3$. The phosphorus concentration of the straight body of the single crystal was $1.1 \times 10^{16}$ atoms/cm$^3$ or less over its entire length. The pressure of the furnace of the single-crystal pulling apparatus was 150 hPa during pulling of the single crystal. The silicon single crystal of n-type was grown so as to have a diameter of 300 mm and a straight body length of 140 cm while a horizontal magnetic field was applied with a central magnetic field strength of 1,000 gauss by the MCZ method. The other conditions were the same as example 1 to pull this single crystal.

Wafers were sampled from the silicon single crystal pulled at positions of 0, 20, 40, 60, 80, 100, 120, and 140 cm away from its shoulder. The oxygen concentration of these wafers at the positions measured by FT-IR is shown in Table 6 below.

TABLE 6

COMPARATIVE EXAMPLE 3

| POSITION IN CRYSTAL cm | OXYGEN CONCENTRATION (ASTM' 79) × $10^{18}$ atoms/cm$^3$ |
|---|---|
| 0 | 1.39 |
| 20 | 1.34 |
| 40 | 1.33 |
| 60 | 1.34 |
| 80 | 1.34 |
| 100 | 1.35 |
| 120 | 1.34 |
| 140 | 1.33 |

As shown in Table 6, the oxygen concentration of the silicon single crystal produced under conditions of comparative example 3 ranged from $1.33 \times 10^{18}$ to $1.39 \times 10^{18}$ atoms/cm$^3$ (ASTM'79).

Comparative Example 4

Raw material of 360-kg polycrystalline silicon was charged into a quartz crucible having a diameter of 32 inches (800 mm) disposed inside a main chamber of a single-crystal pulling apparatus, as in example 1. This raw material was heated and melted with a heater. A phosphorus dopant was introduced to adjust resistivity such that the phosphorus concentration of the shoulder of a single crystal to be pulled was $2.5 \times 10^{16}$ atoms/cm$^3$. The phosphorus concentration of the straight body of the single crystal was $2.5 \times 10^{16}$ atoms/cm$^3$ or more over its entire length. The pressure of the furnace of the single-crystal pulling apparatus was 150 hPa during pulling of the single crystal. The silicon single crystal of n-type was grown so as to have a diameter of 300 mm and a straight body length of 140 cm while no magnetic field was applied (0 gauss).

Wafers were sampled from the silicon single crystal pulled at positions of 0, 20, 40, 60, 80, 100, 120, and 140 cm away from its shoulder. The oxygen concentration of these wafers at the positions measured by FT-IR is shown in Table 7 below.

TABLE 7

| COMPARATIVE EXAMPLE 4 | |
|---|---|
| POSITION IN CRYSTAL cm | OXYGEN CONCENTRATION (ASTM' 79) × $10^{18}$ atoms/cm$^3$ |
| 0 | 1.34 |
| 20 | 1.27 |
| 40 | 1.26 |
| 60 | 1.26 |
| 80 | 1.24 |
| 100 | 1.22 |
| 120 | 1.18 |
| 140 | 1.16 |

As shown in Table 7, the oxygen concentration of the silicon single crystal produced under conditions of comparative example 4 ranged from $1.16\times10^{18}$ to $1.34\times10^{18}$ atoms/cm$^3$ (ASTM'79).

Figure 2:
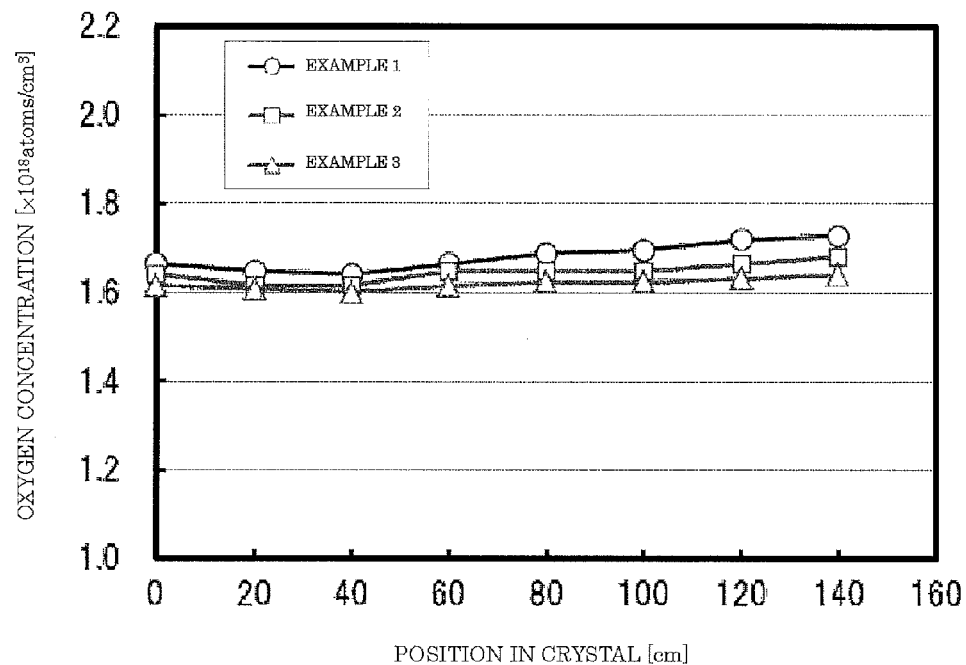
FIG. 2 is a graph showing distribution of the oxygen concentration (ASTM'79) of a phosphorus-doped silicon single crystal in Example of the invention with respect to positions in this crystal.
Figure 3:
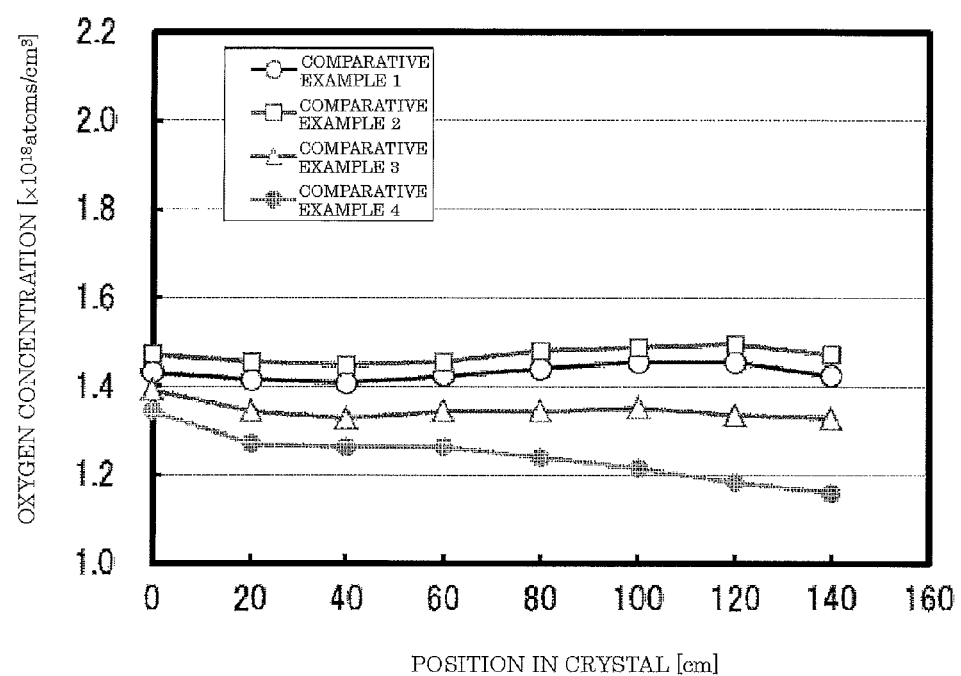
FIG. 3 is a graph showing distribution of the oxygen concentration (ASTM'79) of a phosphorus-doped silicon single crystal in Comparative Example with respect to positions in this crystal.

FIG. 2 shows a graph of all the oxygen concentrations (ASTM'79) measured at the positions in crystal in examples 1 to 3 of the invention. FIG. 3 shows a graph of all the oxygen concentrations (ASTM'79) measured at the positions in crystal in comparative examples 1 to 4.

As shown by the graphs in FIG. 2 and FIG. 3, examples 1 to 3 demonstrated that the straight body of the single crystal exhibited an oxygen concentration of $1.6\times10^{18}$ atoms/cm$^3$ (ASTM'79) or more at all the positions. Comparative examples 1 to 4 had the condition that: the single crystal had a phosphorus concentration of less than $2\times10^{16}$ atoms/cm$^3$, the applied horizontal magnetic field was less than 2,000 gauss, the single crystal had a phosphorus concentration of less than $2\times10^{16}$ atoms/cm$^3$ and the applied horizontal magnetic field was less than 2,000 gauss, and no magnetic field was applied, respectively; all of these comparative examples demonstrated that the straight body of the single crystal exhibited an oxygen concentration of less than $1.6\times10^{18}$ atoms/cm$^3$ (ASTM'79) at all the positions.

The above results revealed that the inventive method of producing a phosphorus-doped silicon single crystal can produce a phosphorus-doped silicon single crystal having an oxygen concentration of $1.6\times10^{18}$ atoms/cm$^3$ (ASTM'79) or more over substantially the entire length of the straight body of the single crystal.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of producing a phosphorus-doped silicon single crystal, comprising pulling the phosphorus-doped silicon single crystal from a silicon melt doped with phosphorus by Magnetic field applied Czochralski (MCZ) method, wherein
   the phosphorus is doped such that a phosphorus concentration of the phosphorus-doped silicon single crystal is $2\times10^{16}$ atoms/cm$^3$ or more,
   a horizontal magnetic field is applied to the silicon melt with a central magnetic field strength of 2,000 gauss or more such that the phosphorus-doped silicon single crystal to be produced has an oxygen concentration of $1.6\times10^{18}$ atoms/cm$^3$ or more, and
   the oxygen concentration is constant over substantially the entire length of a straight body of the crystal.

2. The method according to claim 1, wherein the step of pulling the phosphorus-doped silicon single crystal includes adjusting a pressure of an interior of a furnace in a single-crystal pulling apparatus for use in pulling the phosphorus-doped silicon single crystal to 100 hPa or more.

3. The method according to claim 1, wherein the magnetic field strength 3,000 to 5,000 gauss.

\* \* \* \* \*